United States Patent [19]
Chow

[11] Patent Number: 6,094,086
[45] Date of Patent: Jul. 25, 2000

[54] HIGH DRIVE CMOS OUTPUT BUFFER WITH FAST AND SLOW SPEED CONTROLS

[75] Inventor: Hwang-Cherng Chow, Hsinchu, Taiwan

[73] Assignee: Industrial Technology Research Institute, Hsinchu, Taiwan

[21] Appl. No.: 08/855,844

[22] Filed: May 12, 1997

[51] Int. Cl.[7] .............................................. H03K 17/296
[52] U.S. Cl. .................... 327/396; 327/393; 327/108; 327/404; 326/27; 326/87
[58] Field of Search ................. 326/17, 27, 26, 326/83, 87; 327/170, 172, 175, 108, 109, 111, 112, 374, 393, 394, 395, 396, 398, 399, 401, 404, 434

[56] References Cited

U.S. PATENT DOCUMENTS

| | | | |
|---|---|---|---|
| 4,421,994 | 12/1983 | Puri et al. | 327/112 |
| 5,391,939 | 2/1995 | Nonaka | 326/83 |
| 5,708,386 | 1/1998 | Chow | 327/380 |
| 5,717,343 | 2/1998 | Kwong | 326/27 |

*Primary Examiner*—Jung Ho Kim
*Attorney, Agent, or Firm*—Proskauer Rose LLP

[57] ABSTRACT

An output buffer is provided which receives an input signal and drives an output terminal. The output buffer has a first driver and a second driver for driving the output terminal to a voltage level corresponding to a logic value of the input signal. The second driver has a greater (current) driving capacity than the first driver. The output buffer also has control circuitry which detects a transition in the logic value of the input signal. In response, the control circuitry generates a particular pulse aligned with the input signal logic value transition having a particular constant voltage level for a predetermined time period. Furthermore, the control circuitry delays the second circuit from driving the output terminal to a complementary voltage level corresponding to the logic value to which the input signal transitions during the predetermined time period.

16 Claims, 8 Drawing Sheets

ગુજ6,094,086

HIGH DRIVE CMOS OUTPUT BUFFER WITH FAST AND SLOW SPEED CONTROLS

RELATED APPLICATIONS

This application is related to the following patent application:

U.S. patent application Ser. No. 08/854,393, U.S. Pat. No. 5.850,159, entitled "High and Low Speed Output Buffer with Controlled Slew Rate," filed on even date herewith for Hwang-Cherng Chow, Chen-Yi Huang and Tain-Shun Wu.

The above-listed patent application is assigned to the same assignee as this application and is incorporated herein by reference.

FIELD OF THE INVENTION

The present invention relates to integrated circuit (IC) chips and output driver or output buffer circuits in the IC chips.

BACKGROUND OF THE INVENTION

Output drivers are a class of circuits used, for example in integrated circuit (IC) chips, for purposes of driving a load with a high current drive. Generally speaking, small current driving transistors are used internally in the IC chip but cannot drive a heavy load. Output drivers are provided for outputting such signals externally from the IC with a high current driving capability and therefore can drive a heavy load. As such, output driver circuits are often referred to as "output buffers."

To achieve a high current drive, output buffers typically contain large MOSFET or MOS transistors. (Herein, as per common usage in the art, MOSFET or MOS refer to any insulated gate field effect transistors, preferably polycrystalline silicon gate field effect transistors, and not only metal oxide semiconductor field effect transistors.) Such large transistors present a noise problem for the IC. In particular, the output buffer transistors are connected to a high voltage $V_{DD}$ power supply bus and a low voltage $V_{SS}$ power supply bus. The output buffer transistors furthermore drive an output terminal in the form of a large area bonding pad that has a finite capacitance. During a high speed transition in logic value, the large output buffer transistors can produce a high current. This high current, in turn, can impress a noise voltage on the low and high power supply buses as a result of bonding wire, packaging and other inductances. (Note that the impressed voltage is given by v=L·di/dt, where v is the noise voltage, L is the inductance of the bonding wire, packaging, etc., and di/dt is the derivative of the current generated by the large driver transistors of the output buffer with respect to time. Thus, the more rapidly that the current of the large driver transistors of the output buffer varies in time, the larger the magnitude of the impressed noise signal.) This undesirable noise voltage on the high and low power supply buses is commonly referred to as "ground bounce."

A number of prior art solutions have been proposed to reduce "ground bounce" in output buffers. Of interest is a prior art output buffer 10 shown in FIG. 1 and disclosed in U.S. Pat. No. 4,987,324. As shown, a low current drive driver A and a high current drive driver B are provided for driving the output terminal pad T. The driver A is formed by a PMOS transistor Q1A and an NMOS transistor Q2A connected in a "push-pull inverter" configuration. Specifically, the PMOS transistor Q1A has its source connected to the high voltage $V_{DD}$ power supply bus, its drain connected to the output terminal pad T and its gate connected to an input. The transistor Q2A has its source connected to the low voltage $V_{SS}$ power supply bus, its drain connected to the drain of the transistor Q1A and to the output terminal pad T and its gate connected to the gate of transistor Q1A and the input. The connections of the sources of the transistors Q1A and Q2A to the high voltage $V_{DD}$ and low voltage $V_{SS}$ power supply buses, respectively, provide high voltage and low voltage biasing of the driver A with the high voltage $V_{DD}$ (e.g., 5 volts) and the low voltage $V_{SS}$ (e.g., ground or 0 volts). The driver A drives its output to a voltage which is a complement of the voltage inputted to its input. A predriver inverter E is provided which receives an input signal Vi and outputs a complement of the signal Vi to the input of the driver A.

The driver B is also an inverter formed from the PMOS transistor Q1B and the NMOS transistor Q2B which have their drains connected to the output terminal pad T. The source of the transistor Q1B is connected to the high voltage $V_{DD}$ power supply bus and the source of the transistor Q2B is connected to the low voltage $V_{SS}$ power supply bus. Unlike the driver A, the driver B has two predriver inverters C and D. The inverter C receives the input signal Vi and outputs the complement of this signal to the gate of the transistor Q1B. The inverter D receives the input signal Vi and outputs the complement of this signal to the gate of the transistor Q2B.

During steady-state operation, when the input signal Vi is a logic '0' (low voltage level $V_{SS}$), the inverters E, D and C each output a logic '1' value (high voltage level $V_{DD}$) to the inputs of the transistors Q1A, Q2A, Q1B and Q2B. Transistors Q1A and Q1B, being PMOS transistors, are off and transistors Q2A and Q2B, being NMOS transistors, are on. As such, the transistors Q2A and Q2B both sink any current on the output terminal pad T to the low voltage $V_{SS}$ power supply bus, thereby maintaining the voltage level of the output terminal pad T at $V_{SS}$. On the other hand, when the input signal Vi is a logic value '1' (high voltage level $V_{DD}$), the inverters C, D and E output a logic value '0' (low voltage level $V_{SS}$). The transistors Q2A and Q2B, being NMOS transistors, are off and transistors Q1A and Q1B, being PMOS transistors, are on. As such, the transistors Q1A and Q1B supply a current to the output terminal pad T, thereby maintaining the voltage level of the output terminal pad T at $V_{DD}$.

As noted above, ground bounce is an effect that occurs during a transition in logic value, i.e., from logic '0' to logic '1', or logic '1' to logic '0', of the input signal Vi (which results in a transition in corresponding voltage level of the output terminal pad T from $V_{SS}$ to $V_{DD}$ or from $V_{DD}$ to $V_{SS}$, respectively). To reduce ground bounce, the driver A is provided with smaller sized (i.e., smaller channel width) transistors Q1A and Q2A than the transistors Q2A and Q2B provided in the driver B. Furthermore, the logic threshold voltages or switching voltages of the inverters C, D and E are selected to cause each inverter to switch, i.e., transition its output voltage, at a different time. This can be better understood with reference to FIG. 2. Suppose that the switching voltages of the inverters C, D and E are chosen to be 3.7, 1.1 and 2.5 volts, respectively. As shown, the input signal Vi begins to transition from logic '0' (voltage level $V_{SS}$=0) to logic '1' (voltage level $V_{DD}$=5) at time t0. At time t1, the voltage level of Vi reaches 1.1 volts thereby triggering inverter D to transition its output from logic value '1' to logic '0'. As a result, Q2B begins to turn off. At time t2, the voltage Vi reaches 2.5 volts thereby triggering inverter E to transition its output logic value from '1' to '0'. As a result, Q1A begins to turn on and Q2A begins to turn off. Finally at time t3, Vi reaches 3.7 volts thereby triggering inverter C to transition its output logic value from '1' to '0'. As a result, Q1B begins to turn on. The net effect is that first Q2B turns off at time t1, then Q1A turns on while Q2A turns off at time t2, followed by Q1B turning on at time t3. Thus, the turn on of the larger PMOS transistor Q1B is delayed until after the smaller PMOS transistor Q1A turns on. This is advantageous because the smaller transistor Q1A has a lower current driving capability. Initially, when Q1A turns on, the voltage of the output terminal pad is 0. The transistor Q1A slowly charges up the output terminal pad. Because of the limited current drive of the transistor Q1A and the relatively slow voltage change of the output terminal pad T, little ground bounce is produced. Later, the transistor Q1B turns on with a higher current drive capability. However, at this point, the output terminal pad is partially charged and therefore a rapidly changing current drive is avoided, despite the output terminal pad T being driven by a high current drive transistor Q1B. Because a rapid current change is avoided, ground bounce is suppressed.

Likewise, when the input signal transitions from logic '1' to logic '0', the inverters change their outputted logic values from logic '1' to logic '0' successively in the order of inverter C first, followed by inverter E followed by inverter D. The net effect is that Q1B turns off first, then Q1A turns off and Q2A turns on followed finally by Q2B turning on. Because smaller transistor Q2A turns on first, it begins to slowly discharge the output pad T with its (relatively) low current drive capability. Then, larger transistor Q2B turns on. However, the output terminal pad T is already partly discharged. Thus, Q2B drives the output terminal pad T with a less rapidly changing current. Again, ground bounce is reduced.

While the output buffer 10 can suppress ground bounce, it is not suitable for all applications. For example, in certain applications, the current drive capacity of both the small and large drivers is relatively high. For example, to achieve a requisite current drive in some applications, the transistor Q1A may have a channel width of 200 μm and the transistor Q1B may have a channel width of 1000 μm. As indicated in FIG. 2, during a transition, both transistors Q1A and Q2A are simultaneously on. This produces a short circuit path between the high power supply bus and the low power supply bus. If the transistors Q1A and Q2A are large, then a high short circuit current may be produced which damages the IC.

Second, consider an example where Q1B has a channel width of 800 μm and Q2B has a channel width of 400 m. During a transition in input signal Vi logic value from '0' to '1', the delay in turn on time between transistors Q1B and Q1A is controlled by the relative switching voltages of predrivers E and C. Likewise, during a transition in input signal Vi logic value from '1' to '0', the delay in turn on time between the transistors Q2B and Q2A is controlled by the relative switching voltages of predrivers E and D. However, such delays are not sufficient to reduce ground bounce in certain applications for such large transistors Q1B and Q2B.

FIG. 3 shows a low speed output buffer 20 proposed by Intel™, a semiconductor manufacturer located in Santa Clara California. An output pad Dx is selectively driven by PMOS pull-up driver transistor P4', having a source connected to the high voltage $V_{DD}$ power supply bus and a drain connected to the output pad Dx, or NMOS pull-down driver transistor N4' having a source connected to the low voltage $V_{SS}$ power supply bus and a drain connected to the output pad Dx. PMOS quick turn off transistor P3' receives a signal P_EN. When P_EN is logic '0', P3' turns on and drives the gate of P4' to the high voltage level $V_{DD}$ thereby turning off P4'. Otherwise, when P_EN is logic '1', P3' is off and does not drive the gate of P4' to any voltage level. Likewise, NMOS quick turn off transistor N3' receives a signal N_EN. When N_EN is logic '1', N4' quickly turns on and drives the gate of N4' to the low voltage level $V_{SS}$, thereby turning off N4'. Otherwise, when N_EN is logic '0', N3' is off and does not drive the gate of N4' to any voltage level.

Connected to the gates of P4' and N4' are analog differential amplifiers 22 and 24, respectively. The amplifier 22 receives the signal P_EN as an enable signal and the amplifier 24 also receives the signal N_EN as an enable signal. The positive (noninverting) inputs of each amplifier 22 and 24 are connected together. Each amplifier 22 and 24 receives a signal CNTR at a negative (inverting) input. The voltage level of CNTR is selected to cause amplifiers 22 and 24 to selectively output a low or negative voltage or high or positive voltage, depending on the voltage applied to the positive inputs (as described in greater detail below). Also connected to the positive inputs of the amplifiers 22 and 24 is the drain of a PMOS transistor P2' and the drain of an NMOS transistor N2'. The source of the transistor P2', in turn is connected to the drain of a transistor P1'. The source of the transistor P1' is connected to the high voltage $V_{DD}$ power supply bus. The source of transistor N2' is connected to the drain of a transistor N1'. The source of the transistor N1' is connected to the low voltage $V_{SS}$ power supply bus.

The gate of the transistor N2' receives the signal P_EN and the gate of the transistor P2' receives the signal N_EN. The gate of the transistor P1' receives the steady voltage PBIAS. PBIAS is selected so that transistor P1' produces a particular maximum current for reasons discussed below. Likewise, the gate of the transistor N1' receives the steady voltage NBIAS, selected so that transistor N1' produces a particular maximum current. Connected between the common positive input connection of the amplifiers 22 and 24 and the output terminal pad Dx is a capacitor C1 with a particular capacitance.

The operation of the output buffer 20 is as follows. When the data to be outputted is logic '0', the signal N_EN is a logic '0' and the signal P_EN is a logic '0'. As a result, amplifier 22 is disabled because it does not receive a high voltage of signal P_EN. P3' is on and maintains the voltage on the gate of P4' at a high level. Thus P4' remains off. N2' is off but P2' is on. Therefore, P1' and P2' maintain the charge on C1 at a high voltage level (which is less than $V_{DD}$). The high voltage level of C1, also inputted to the positive input of amplifier 24 exceeds the voltage level inputted to the negative input of amplifier 24 (on signal CNTR). Thus, amplifier 24 outputs a positive voltage level to the gate of N4'. N3' is off and does not drive the gate of N4'. As such, N4' remains on and maintains the voltage of the output terminal pad Dx at a low voltage level $V_{SS}$.

Now consider the case where a logic '1' is to be outputted. Both P_EN and N_EN are logic '1'. Amplifier 24 is disabled because it does not receive a low voltage of signal N_EN. N3' is on and drives the gate of N4' thereby maintaining the voltage level of the gate of N4' at a low level. As such N4' remains off. P2' is off and N2' is on. As such, N1' and N2' maintain the charge on C1 at a low voltage level (which is greater than $V_{SS}$). This low voltage level, in turn, is inputted to the positive input of the amplifier 22. Because the low voltage level is less than the voltage level received at the negative input of the amplifier 22 (i.e., supplied by the signal CNTR), the amplifier 22 outputs a low or negative voltage. P3' is off and does not drive the gate of P4'. Since the gate of P4' receives only the low voltage of the amplifier 22, P4' remains on and maintains the voltage of the output terminal at a high voltage level $V_{DD}$.

Consider now a transition in logic value from '0' to '1'. In such a case, both P_EN and N_EN transition in logic value from '0' to '1'. P3' turns off, N3' turns on and amplifier 24 turns off. As such, N4' turns off quickly. P2' turns off and N2' turns on. Thus, N1' and N2' gradually discharge the capacitor C1. Capacitor C1 discharges over a delay period. As C1 discharges, the voltage applied to the positive inputs of the amplifiers 22 and 24 decreases and the voltage outputted from the amplifier 22 gradually decreases. This causes P4' to gradually turn on. As P4' turns on, it gradually charges the output terminal pad Dx to a high voltage.

Consider now a transition in logic value from '1' to '0'. In such a case, both P_EN and N_EN transition in logic value from '1' to '0'. This causes N3' to turn off P3' to turn on and amplifier 22 to turn off. As such, P4' turns off quickly. P2' turns on and N2' turns off. As a result, P2' and P1' begin to charge C1 over a delay period. As C1 charges, the voltage supplied to the positive inputs of the amplifier 22 gradually increases. This causes the voltage outputted from the amplifier 22 to increase gradually, which output voltage, in turn, gradually turns on N4'. As N4' turns on, it gradually discharges the output terminal pad Dx to a low voltage.

Thus, the low speed output buffer 20 has an advantage of a gradual transition thereby reducing ground bounce and stabilizing the rise and fall times of the output terminal pad. The output buffer 20, however, has two disadvantages. First, the capacitor C1 is difficult to implement in an IC. Because the voltage of the two terminals of C1 is neither at $V_{DD}$ or $V_{SS}$, the capacitor C1 must be implemented from two separate layers of polycrystalline silicon separated by a dielectric layer, especially when C1 must remain within precise tolerances. Thus, the output buffer 20 is more expensive and complex. Second, the output buffer 20 has a high power consumption.

FIG. 4 shows another output buffer circuit 50 disclosed in U.S. Pat. No. 4,820,942. As shown, the complement of an output signal, an OE signal and the complement of the OE signal are received at an AC or transient driver 52 and a DC or steady state driver 54. In this case, the AC driver 52 includes two weak current driving NMOS transistors Q1 and Q2 and the DC driver 54 includes two strong current driving NMOS transistors Q3 and Q4. Gates G1–G5 are provided which, in response to a logic '1' valued output signal (logic '0' valued complement of the output signal), enable the transistor Q1 to drive the output terminal 59 to a high voltage or logic '1' value (and disable the transistor Q2). The gates G1–G5 furthermore, in response to a logic '1' valued output signal (logic '1' valued complement of the output signal), enable the transistor Q2 to drive the output terminal 59 to a low voltage or logic '0' value (and disable the transistor Q1). When OE is logic '0', both transistors Q1 and Q2 are disabled.

Also provided is a delay circuit 56 connected between an output of a NOR gate G9 and an input of a NOR gate G8. Likewise, a delay circuit 58 is connected between an output of the NOR gate G8 and an input of the NOR gate G9. The NOR gates G8 and G9 also receive the complement of OE. The gate G9 receives the output signal, via inverters G6 and G7, as an input. The gate G8 receives the complement of the output signal, via inverter G6, as an input. The output of the gate G8 is connected to the gate of transistor Q3 and the output of gate G9 is connected to the gate of transistor Q4. When the complement of OE is a logic '1', both gates G8 and G9 output a logic '0' or low voltage which disables both the transistors Q3 and Q4.

Consider first the case where the output signal is a logic '1' and thus the complement of the output signal is logic '0'. The gate G8 receives logic '0' on each of its inputs (OE complement, output signal complement and output of gate G9) and therefore outputs a logic '1'. The gate G9 receives the logic '1' output signal directly, and the logic '1' output of the gate G8, via delay circuit 58. Therefore, the gate G9 outputs a logic '0'. Thus, the AC transistor Q1 and DC transistor Q3 are on. When the output signal transitions from logic '1' to logic '2', the transistors Q1 and Q3 are turned off quickly and the AC transistor Q2 is turned on quickly. The DC transistor Q3 turns off quickly because the change in logic value of the output signal changes one of its inputs to logic '1' without delay, thereby resulting in the NOR gate G8 quickly changing to outputting a logic '0'. Thus, initially, only the small driving capacity AC transistor Q2 turns on to slowly discharge the output terminal 59 thereby driving it to a low voltage (logic '0'). The transition in logic value of the NOR gate G8 from logic '1' to logic '0' takes a predetermined delay to propagate through the delay 58 before it is received at the gate G9. Eventually, after the predetermined delay period of the delay 58, the logic gate G9 receives the logic '1' output of the gate G8 from the delay 58. This changes the output of the NOR gate G9 to logic '1' (because now the gate G9 receives all logic '0' values as inputs). Thus, after the delay period of the delay circuit 58, the gate G9 changes its output to logic '1' thereby enabling the DC transistor Q4. Thus, eventually, DC transistor Q4 turns on and assists AC transistor Q2 in driving the output terminal 59 to a low voltage. Transistors Q2 and Q4 remain on thereafter to maintain the output terminal 59 voltage at a low voltage (logic '0').

Consider now the case where the output signal initially is logic '0' and thus the complement of the output signal is logic '1'. The AC transistor Q2 is on and the AC transistor Q1 is off. Each input to the gate G9 is a logic '0'. Thus, the gate G9 outputs a logic '1' to the DC transistor Q4 which is on. The gate G8 receives two logic '1' inputs (output of gate G9 and complement of output signal) and thus outputs a logic '0'. Thus, the DC transistor Q3 is off When the output signal transitions to the logic '1' state, the AC transistor Q2 quickly turns off and the AC transistor Q1 quickly turns on. The gate G9 quickly transitions its output to logic '0' thereby quickly turning off the DC transistor Q4. Thus, initially, only the small driving capacity AC transistor Q1 is turned on for slowly charging up the output terminal 59 and driving it to a high voltage (logic '1'). The delay circuit 56 eventually propagates the logic '0' output of the gate G9, after a predetermined delay, to the gate G8. Likewise, the gate G8 receives the complement of the output signal, namely, logic '0'. Since all inputs to the gate G8 are now logic '0', the gate G8 transitions its output to a logic '1' (after the delay of the delay circuit 56). This turns on DC transistor Q3 which assists in driving the terminal to a high voltage (logic '1'). The transistors Q1 and Q3 thereafter remain on to maintain the output terminal 59 voltage at a high voltage.

By delaying the turn on of the large capacity (DC) transistors Q3 and Q4, the production of ground bounce in the output buffer is reduced. However, the output buffer 50 is not suitable for all applications. For example, a new standard called the Universal Serial Bus (USB), was recently approved for computer equipment peripherals. According to USB, devices can communicate data at a full speed of 12 Mbit/sec or a low speed of 1.5 Mbit/sec. The USB standard specifies precise rise and fall rates of output voltage levels of USB compliant devices of about 4–20 nsec for full speed data communication but only 75–300 nsec for low speed communication. This presents a problem for ground bounce suppressing output buffers which are typically designed with slew rates for only a single particular data communication rate. For example, the delay circuits 56 and 58 in the output buffer 50 are formed as a tandem connection of multiple inverters. The delay achieved by such delay circuits 56 and 58 is very sensitive to the high voltage $V_{DD}$ level of the high voltage power supply bus (which usually is designed to vary up to 10% of the desired level), operating temperature and process variation. Therefore, it is difficult to design a delay circuit 56 or 58 that achieves an adequate delay during low speed operation, e.g., in a USB IC application wherein both full and low speed data communication must be accommodated. Furthermore, to achieve a 75 nsec delay, as would be necessary to comply with USB specified operating conditions, the delay circuits 56 and 58 would occupy a large amount of precious area on the IC chip. As such, the output buffer 50 is not suitable for a USB IC application.

It is an object of the present invention to overcome the disadvantages of the prior art.

SUMMARY OF THE INVENTION

This and other objects are achieved according to the invention. According to one embodiment an output buffer is provided which receives an input signal and drives an output terminal. The output buffer has a first driver and a second driver for driving the output terminal to a voltage level corresponding to a logic value of the input signal. The second driver has a greater (current) driving capacity than the first driver. The output buffer also has control circuitry which detects a transition in the logic value of the input signal. In response, the control circuitry generates a particular pulse aligned with the input signal logic value transition having a particular constant voltage level for a predetermined time period. Furthermore, the control circuitry delays the second circuit from driving the output terminal to a complementary voltage level corresponding to the logic value to which the input signal transitions during the predetermined time period.

Illustratively, the control circuitry receives at least one mode signal. The control circuitry delays the second driver from driving the output terminal to the complementary voltage level during the predetermined time period, but only in response to a low speed mode indication of the mode signal(s). The control circuitry delays the second driver from driving said output terminal to the complementary voltage level by a second period, that is less than the predetermined period, in response to a full speed mode indication of the mode signal(s). In any event, the second delay or the predetermined period delay illustratively causes the second driver to begin driving the output terminal after the first driver has begun driving the output terminal.

To generate the pulse having a constant voltage over a predetermined period, illustratively, an edge detector is provided for outputting a first pulse that is aligned with a transition of the input signal logic value. The first pulse is illustratively received by a pulse generator that generates the appropriate pulse with constant voltage level over a predetermined period. The pulse generator may itself be a monostable formed by a MOS transistor, resistive load and inverter, such as a Schmidt trigger. The MOS transistor receives the first pulse at its gate. The drain of the MOS transistor is connected to the input of the inverter. In response to the first pulse, the MOS transistor drives the input of the inverter to a different voltage level. After the pulse, the voltage level of the inverter input is restored by a current flowing through the resistive load. Nevertheless, the inverter changes its output voltage to a constant level until the voltage level of its input crosses a predetermined threshold.

DETAILED DESCRIPTION OF THE INVENTION

Figure 1:
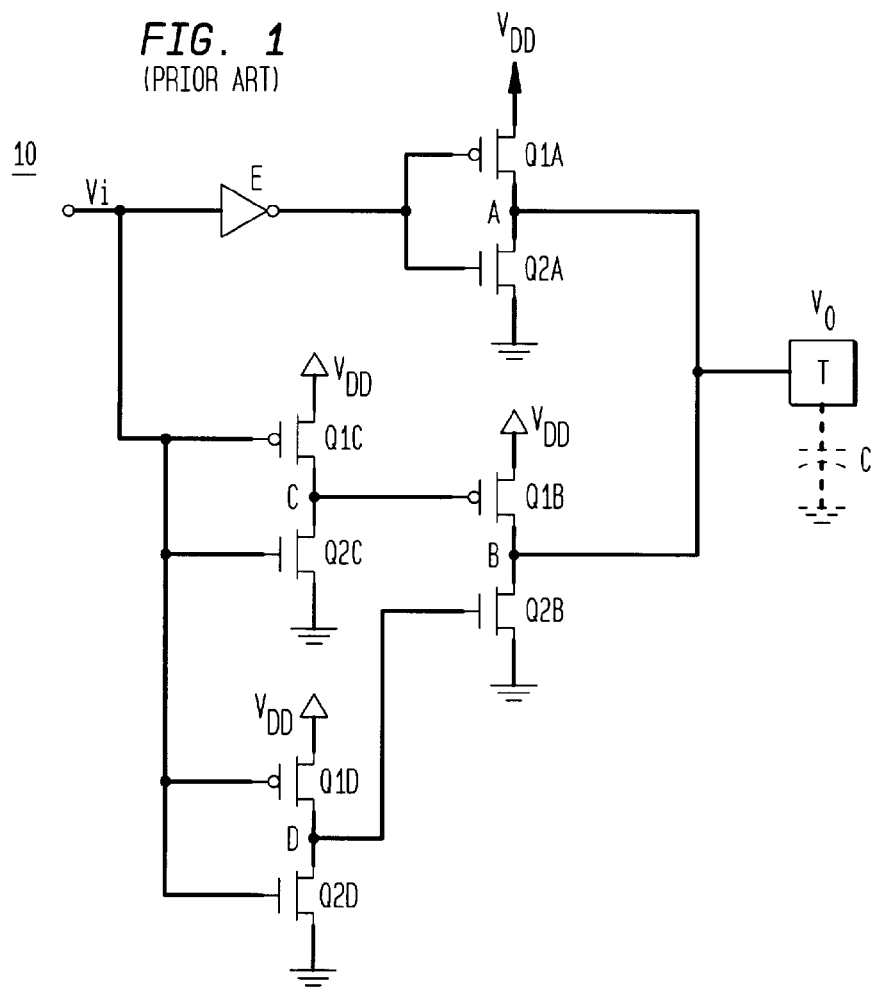
FIG. 1 shows a first conventional output buffer.
Figure 2:
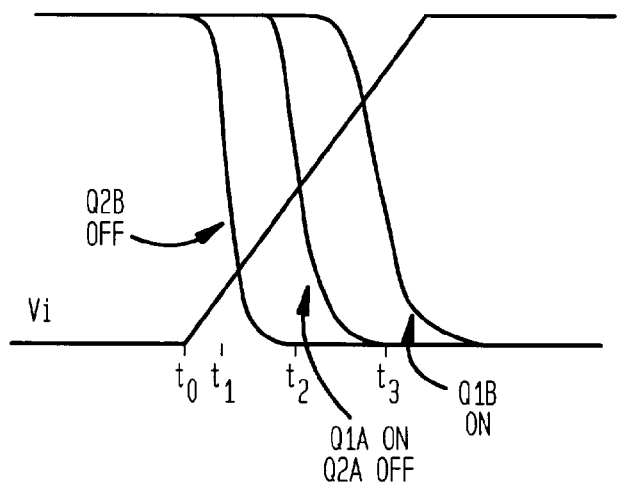
FIG. 2 shows a conventional voltage plot for the output buffer of FIG. 1.
Figure 3:
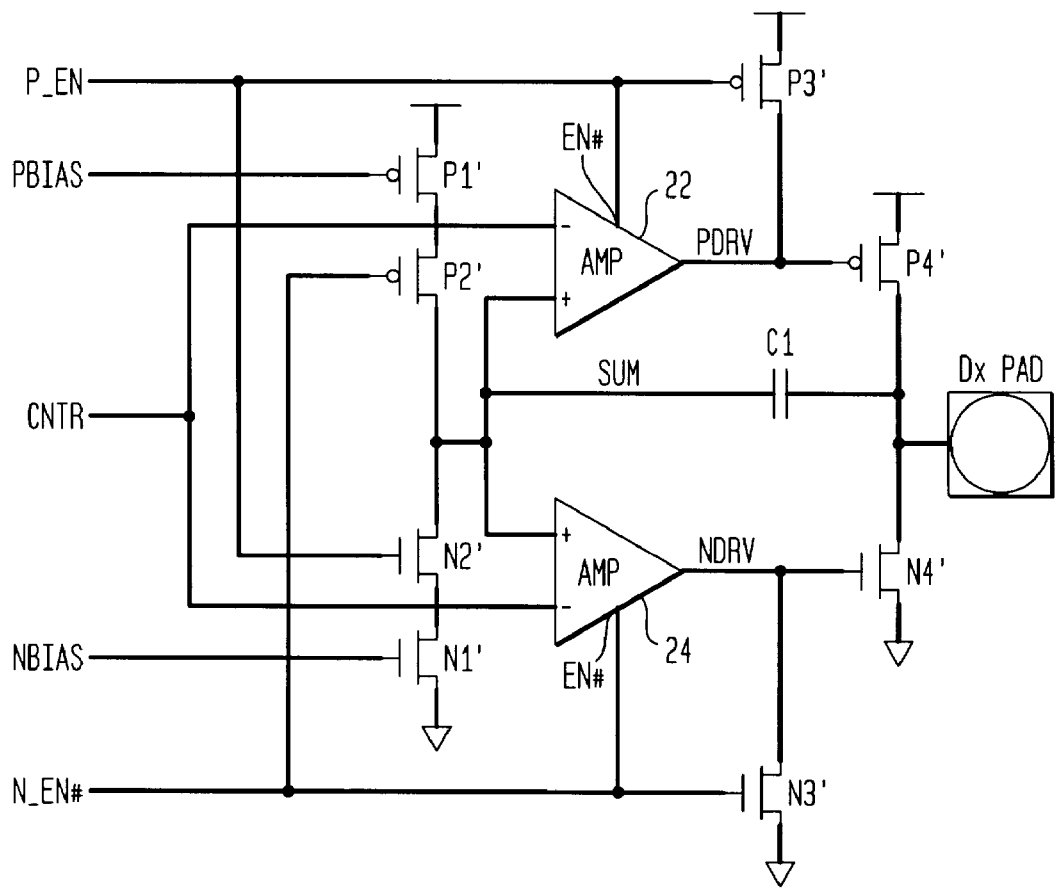
FIG. 3 shows a second conventional output buffer.
Figure 4:
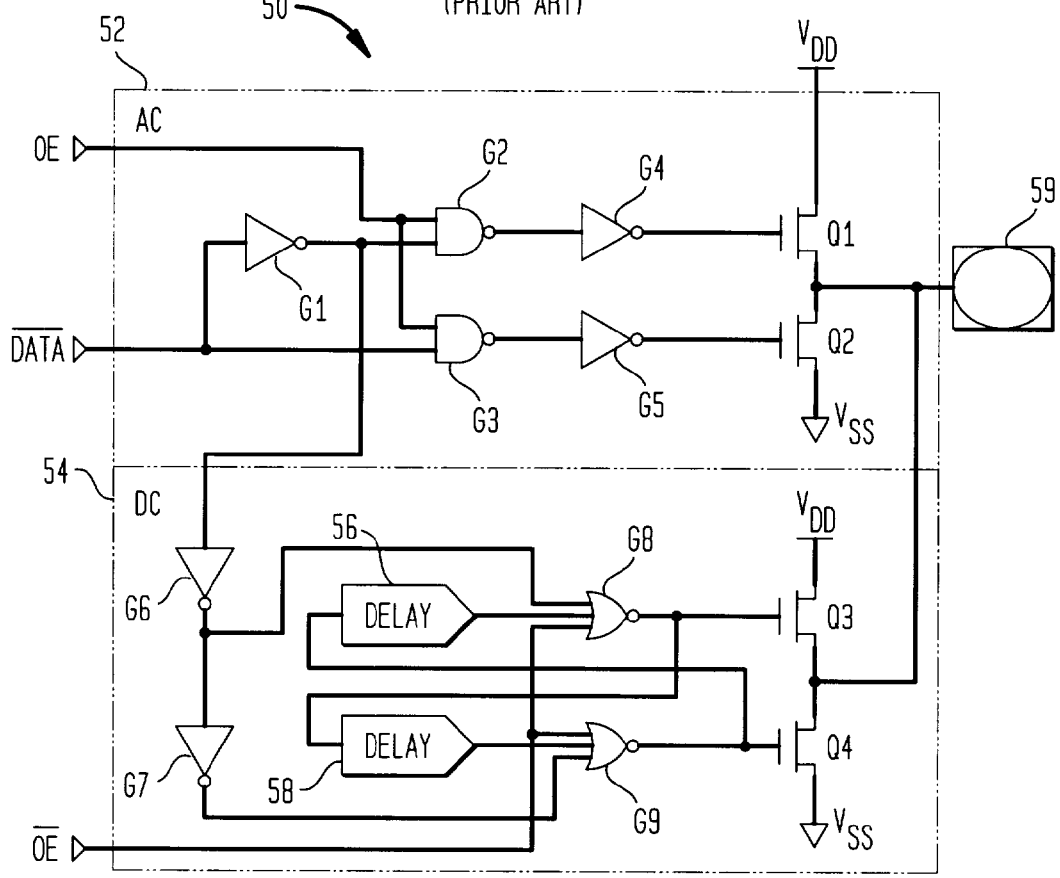
FIG. 4 shows a third conventional output buffer.
Figure 5:
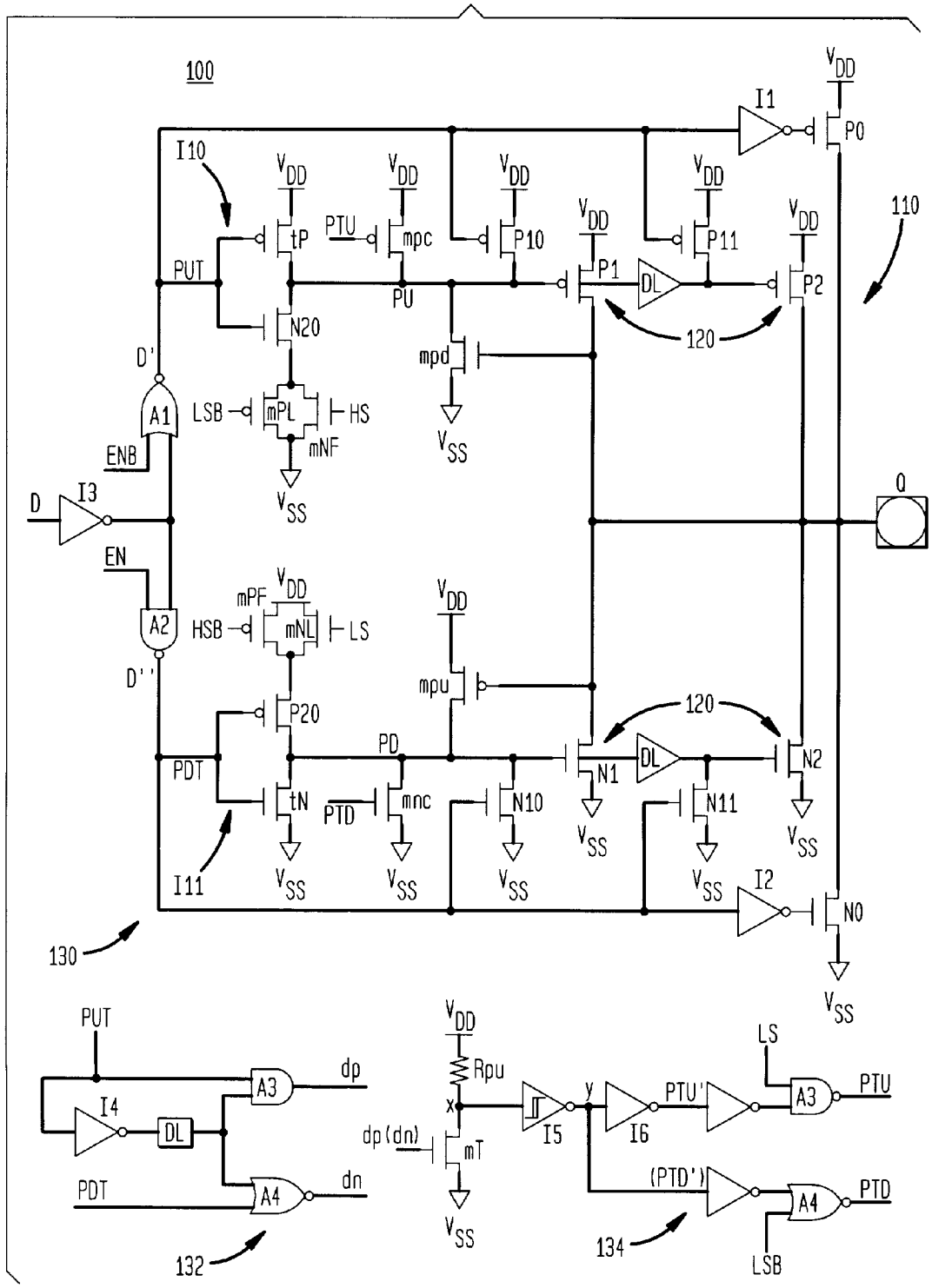
FIG. 5 shows an output buffer according to an embodiment of the present invention.

FIG. 5 shows an output buffer according to an embodiment of the present invention. The output buffer 100 has two drivers, namely, a (relatively) low current drive driver 110 and a high current drive driver 120. An input signal is received at an inverter I3 of the control circuitry 130. The complement of the input signal is outputted from inverter I3 to NOR gate A1 and to NAND gate A2 of the control circuitry 130. NOR gate A1 receives the signal ENB as a second input and NAND gate A2 receives signal EN as a second input where ENB is the complement of EN. When ENB is logic '1' and EN is logic '0' the output buffer is disabled. That is, the signal D' produced at the output of NOR gate A1 is always logic '0' and the signal D" produced at the output of NAND gate A2 is always logic '1', regardless of the logic value of D. On the other hand, when ENB is logic '0' and EN is logic '1', the output buffer 100 is enabled. In particular, signals D' and D" are the same as input signal D.

The driver 110 includes PMOS transistor P0 having a source connected to a high voltage $V_{DD}$ power supply bus and a drain connected to an output terminal pad Q. The driver 110 also includes NMOS transistor N0 having a source connected to a low voltage $V_{SS}$ power supply bus and a drain connected to an output terminal pad Q.

The driver 120 includes two PMOS transistors P1 and P2 and two NMOS transistors N1 and N2. The sources of P1 and P2 are connected to the high voltage $V_{DD}$ power supply bus. The sources of the transistors N1 and N2 are connected to the low voltage $V_{SS}$ power supply bus. The drains of the transistors P1, P2, N1 and N2 are connected to the output terminal pad Q. The gate of the transistor P1 is connected to the gate of the transistor P2 via a delay element DL. The gate of the transistor N1 is connected to the gate of the transistor N2 via a delay element DL. The delay element DL may be formed from inverters or resistors. For example, it is known to form the delay element DL as a simple extension of the resistive polycrystalline silicon gate of the transistor P1 to the transistor P2 or the transistor N1 to the transistor N2. The purpose of the delay elements DL is to delay the propagation of a turn on signal from the gate of N1 or P1 to the gate of N2 or P2, respectively. As a result, when a low voltage signal is applied to the gate of P1, P1 turns on first and P2 turns on after some delay caused by the delay element DL connected between P1 and P2. Likewise, when a high voltage signal is applied to the gate of N1, N1 turns on first and N2 turns on after some delay caused by the delay element DL connected between N1 and N2. This gradual turn-on of the transistors P1–P2 or N1–N2 tends to suppress ground bounce.

On the other hand it is desirable to turn off the transistors P1 and P2 or N1 and N2 rapidly. To that end, PMOS transistors P10 and P11 are provided with their sources connected to the high voltage $V_{DD}$ power supply bus and their drains connected to the gates of P1 and P2, respectively. The gates of transistors P10 and P11 both receive the signal D' (when the output buffer 100 is enabled) which has the same logic value as input signal D. When it is desirable to turn off transistors P1 and P2, (i.e., when outputting a logic '0' from output terminal Q) signal D' (having a logic value of '0') turns on P10 and P11 which quickly charge up the gates of P1 and P2, thereby turning them off.

Likewise NMOS transistors N10 and N11 are provided with their sources connected to the low voltage $V_{SS}$ power supply bus and their drains connected to the gates of transistors N1 and N2, respectively. The gates of N10 and N11 receive the signal D" which has the identical value as D'. When it is desirable to turn off the transistors N1 and N2 (i.e., when outputting a logic '1' from output terminal Q) signal D" (having a logic value of '1') turns on N10 and N11 which quickly discharge the gates of N1 and N2, thereby turning them off.

Control circuitry 130 is also provided predrivers for predriving the drivers 110 and 120. In the case of the driver 110, the control circuitry 130 includes two predriver inverters I1 and I2. The gate of P0 is connected to an output of predriver inverter I1. The gate of N0 is connected to an output of predriver inverter I2. An input of inverter I1 receives the signal D' and an input of inverter I2 receives signal D" in parallel.

Illustratively, inverter I2 has a logic threshold or switch voltage level less than $(V_{DD}-V_{SS})/2$ and inverter I1 has a switch voltage threshold greater than $(V_{DD}-V_{SS})/2$.

In the case of driver 120, the control circuitry 130 includes inverters I10 and I11, low speed predetermined delay transistors mpc and mnc, feedback transistors mpd and mpu, edge detector 132 and pulse generator 134.

Inverter I10 includes PMOS transistor tp and NMOS transistor N20 connected in a push-pull configuration, with the gates of tp and N20 connected to the input of I10 and the drains of tp and N20 connected to the output of I10. The source of tp is connected to the high voltage $V_{DD}$ power supply bus. The source of N20 is connected via PMOS transistor mPL and NMOS transistor mNF to the low voltage $V_{SS}$ power supply bus. The gate of mPL receives the LSB mode signal and the gate of mNF receives the HS mode signal. These mode signals are discussed in greater detail below. As described below, LSB and HS have the same logic value. Thus, either mNF is on, when LSB=HS=logic '1', or mPL is on, when LS=HBS=logic '1'. In the latter case, the inverter I10 functions as an inverter with switch voltage level>$V_{DD}/2$. (Since illustratively $V_{SS}=0$, $(V_{DD}-V_{SS})/2=V_{DD}/2$.) In the former case, I10 also functions as an inverter with a switch voltage level>$V_{DD}/2$. The reason is as follows. In both cases, the path from the low voltage $V_{SS}$ power bus flows through two series connected MOS transistors. This tends to cut their total sinking current drive in half. As a result, a voltage higher than $V_{DD}/2$ must be applied to the inverter I10 to turn tp off more than N20 is turned on in order to transition the outputted control signal applied to node PU.

Inverter I11 includes NMOS transistor tn and PMOS transistor P20 connected in a push-pull configuration, with the gates of tn and P20 connected to the input of I20 and the drains of tn and P20 connected to the output of I11. The source of tn is connected to the low voltage $V_{SS}$ power supply bus. The source of P20 is connected via NMOS transistor mNL and PMOS transistor mPF to the high voltage $V_{DD}$ power supply bus. The gate of mNL receives the LS mode signal and the gate of mPF receives the HSB mode signal. These mode signals are discussed in greater detail below. As described below, LS and HSB have the same logic value. Thus, either mPF is on, when HS=LSB=logic '1', or mNL is on, when LS=HSB=logic '1'. In the latter case, the inverter I11 functions as an inverter with switch voltage level<$V_{DD}/2$. In the former case, I11 also functions as an inverter with a switch voltage level<$V_{DD}/2$. The reason is as follows. In both cases, the path from the high voltage $V_{DD}$ power supply bus flows through two series connected MOS transistors. This tends to cut their total source/surging current drive in half. As a result, a voltage lower than $V_{DD}/2$ must be applied to the inverter I11 to turn tn off more than P20 is turned on in order to transition the output voltage level.

Transistor mpc is a PMOS transistor with its source connected to the high voltage $V_{DD}$ power supply bus, its drain connected to the output of inverter I10 and its gate selectively receiving a pulse signal PTU (described below). The sinking current drive of inverter I10 is less than the source/surging current drive of PMOS transistor mpc. Thus, even though I10 may drive down the node PU to $V_{SS}$, if mpc is enabled, mpc is capable of maintaining PU at a high voltage level near $V_{DD}$. As described in greater detail below, during low speed operation mode, the signal PTU receives a pulse during a transition in input signal D logic value from '0' to '1'. During the pulse time, mpc maintains node PU at a high voltage level during the pulse time period of PTU. Both inverter I10 and mpc drive the gates of P1 and P2 (via delay element DL).

Like mpc, an NMOS transistor mnc is provided with its source connected to the low voltage $V_{SS}$ power supply bus, its drain connected to the output of inverter I11 and its gate selectively receiving a pulse signal PTD (described below). The source/surging current drive of inverter I11 is less than the sinking current drive of PMOS transistor mnc. Thus, even though I11 may drive up the node PU to $V_{DD}$, if mnc is enabled, mnc is capable of maintaining PD at a low voltage level near $V_{SS}$. As described in greater detail below, during low speed operation mode, the signal PTD receives a pulse during a transition in input signal D logic value from '1' to '0'. During the pulse time, mnc maintains node PD at a low voltage level during the pulse time period of PTD. Both inverter I11 and mnc drive the gates of transistors N1 and N2 (via delay element DL).

Feedback transistors mpd and mpu are provided for reinforcing the turn on of transistor P1 or N1, respectively, when they drive the output terminal Q. Thus, as P1 turns on and begins to drive Q up to $V_{DD}$, mpd turns on and further drives down the voltage level of the gate of P1 to increase the turn on of P1. Likewise, as N1 turns on and begins to drive Q down to $V_{SS}$, mpu turns on and further drives up the voltage level of the gate of N1 to increase the turn on of N1.

As mentioned above, during low speed operation, a pulse is provided in signals PTU or PTD during a transition in input signal logic value. Such pulses are generated using edge detector 132 and pulse generator 134 of control circuitry 130. The edge detector 132 receives signal PUT and PDT which may simply be the input signal D. Signal PUT is received at a first input of an AND gate A3. PUT is also inputted to inverter I4 and the complement of PUT is inputted to delay element DL. The delayed complement of PUT is received at a second input of AND gate A3. PDT is received at a first input of NOR gate A4. The delayed complement of PUT is also received at a second input of NOR gate A4. The signal dp or the signal dn outputted from AND gate A3 or NOR gate A4 is inputted to the pulse generator circuit 134 which is configured as a monostable. The signal dp or dn is received at a gate of an NMOS transistor mT. The source of mT is connected to the low voltage $V_{SS}$ power supply bus. The drain (node x) of mT is connected via a resistive load, e.g. a resistor Rpu, to the high voltage $V_{DD}$ power supply bus. The drain of mT is furthermore connected to an input of an inverter I5. Illustratively, the inverter I5 is a Schmidt trigger with a predetermined trigger threshold voltage. The output (node y) of the inverter I5 is the signal PTD'. To generate the signal PTU', the output of the inverter I5 is simply inverted by inverter I6.

The signal PTU is inputted (i.e., via an inverter) to one input of NAND gate A5. NAND gate A5 receives the mode signal LS at a second input. Likewise, PTD is inputted (via an inverter) to one input of NOR gate A6. NOR gate A6 receives the mode signal LSB as a second input. The purpose of the gates A5 and A6 is to disable the signals PTU and PTD during full speed operating mode and to only enable them during low speed operating mode. Thus, when LSB is a logic '0' and LS is a logic '0' (i.e., during full speed operation mode) PTU is a logic '1' and PTD is a logic '0', regardless of the logic values of PTD' or PTU'. On the other hand, when LSB is a logic '0' and LS is a logic '1' (i.e., during low speed operation mode), PTU=PTU' and PTD=PTD'.

Figure 6:
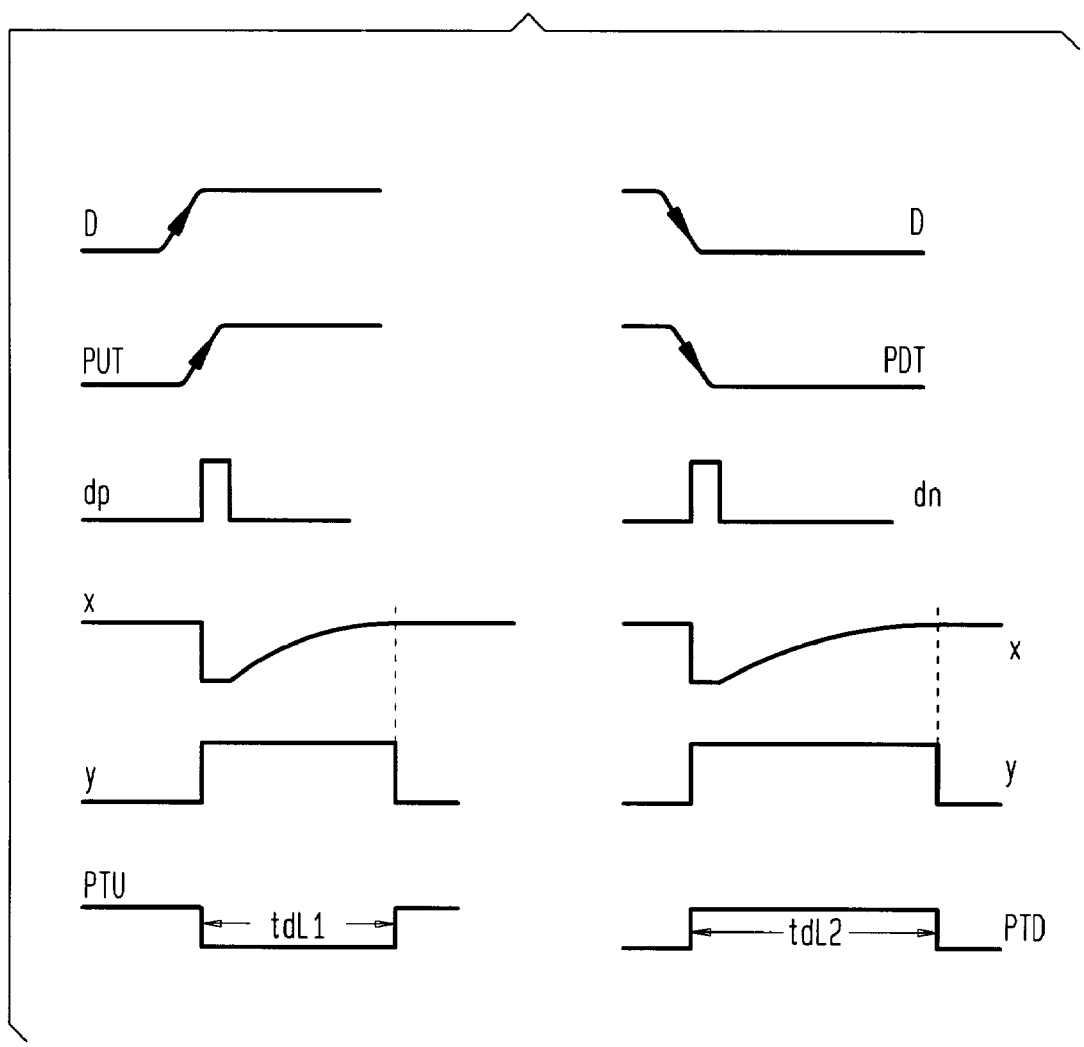
FIG. 6 shows plots of signals explaining the generation of delay pulses.

The operation of the edge detection circuit 132 and pulse generator is now described with reference to FIG. 6. As shown, when input signal D transitions from logic '0' to logic '1', PUT transitions from logic '0' to logic '1'. As a result, the inputs to gate A3 are temporarily both logic '1'. During this short time, the gate A3 outputs a logic '1' pulse, which is aligned with the rising edges of PUT and the logic transition of input signal D, as signal dp.

The pulse of signal dp, causes transistor mT to turn on and discharge its output node x. When x is discharged to $V_{SS}$, the inverter I5 outputs a $V_{DD}$ voltage level. As soon as the voltage level of node x falls to a certain level, inverter I5 changes the voltage level of its output y from $V_{SS}$ to $V_{DD}$. After the falling edge of the pulse in signal dp, mT turns off and node x begins to charge up due to a current supplied from the high voltage $V_{DD}$ power supply bus through resistor Rpu. Nevertheless, the inverter I5 maintains the voltage level of its output y at $V_{DD}$ until the voltage level of node x crosses the threshold trigger voltage level of the inverter I5. The inverter I6, in turn, inverts the voltage outputted at node y. As shown, this produces a voltage pulse in signal PTU' (and thus PTU) with a constant level, i.e., $V_{SS}$. The production of the pulse in signal PTD is similar and is therefore omitted.

The threshold trigger voltage level of I5 and the resistance Rpu can be manufactured with little process variation. In addition, over the expected temperature operating range of the output buffer 100, the resistance Rpu and threshold trigger voltage level of I5 are relatively static. As such, it is possible to produce a pulse having a predetermined pulse period which can be determined rather precisely and which will not vary substantially over the operating conditions of the output buffer 100.

The steady state operation of the output buffer 100 is now discussed, assuming that the output buffer 100 is enabled. Assume first that the input signal D is a logic '0' (and thus signals D' and D" are logic '0'). As such, I1 outputs a logic '1' to P0 turning it off and I2 outputs a logic '1' to N0 turning it on. I0 outputs a logic '1' to P1 and P2 turning them off and I1 outputs a logic '1' to N1 and N2 turning them on. Thus, N0, N1 and N2 maintain the voltage level of output terminal Q at $V_{SS}$.

Assume now that input signal D is a logic '1' (and thus signals D' and D" are logic '1'). As such, I1 outputs a logic '0' to P0 turning it on and I2 outputs a logic '0' to N0 turning it off. I10 outputs a logic '0' to P1 and P2 turning them on and I11 outputs a logic '0' to N1 and N2 turning them off. Thus, P0, P1 and P2 maintain the voltage level of output terminal Q at $V_{DD}$.

The operation of the output buffer 100 during transitions is now discussed. As noted above, the output buffer 100 can accommodate two data communication rates referred to as "full speed" and "low speed." For instance, if the output buffer 100 is in a USB compliant IC, the output buffer 100 outputs data at 12 Mbits/sec during the full speed operating mode and outputs data at 1.5 Mbits/sec during the low speed operating mode. However, these are simply illustrative data rates.

Assume first that full speed mode is selected. In such a case, HS=LSB='1' and HSB=LS='0'. Transistors mPL, mNL, mpc and mnc are disabled. Consider the case that input signal D transitions from logic value '0' to logic value '1'. As the voltage level of signal D rises, the switch voltage levels of inverters I2 and I11 are reached before the voltage level of input signal D reaches $V_{DD}/2$. First, I2 transitions its outputted control signal to logic '0' and then I11 transitions its outputted control signal to logic '0'. As such, N0 turns off, followed by N1 and N2 turning off shortly thereafter. Quick turn off transistors N10 and N11 assist in turning off N1 and N2.

As the voltage level of input signal D continues to rise, eventually, the switch voltage levels of I1 and I10 are reached after the voltage level of the input signal D rises above $V_{DD}/2$. First, I1 transition its output control signal to logic '0' and then I0 transitions its outputted control signal to '0'. As such, P0 turns on, followed by P1 and P2 turning on thereafter. Feedback transistor mpd assists in turning on transistor P1. P0, P1 and P2 drive the output terminal Q to $V_{DD}$.

Consider now the case that input signal D transitions from logic value '1' to logic value '0'. As the voltage level of signal D falls, the switch voltage levels of inverters I1 and I10 are reached before the voltage level of input signal D reaches $V_{DD}/2$. First, I1 transitions its outputted control signal to logic '1' and then I10 transitions its outputted control signal to logic '1'. As such, P0 turns off, followed by P1 and P2 turning off shortly thereafter. Quick turn off transistors P10 and P11 assist in turning off P1 and P2.

As the voltage level of input signal D continues to fall, eventually, the switch voltage levels of I2 and I11 are reached after the voltage level of the input signal D falls below $V_{DD}/2$. First, I2 transitions its outputted control signal to logic '1' and then I11 transitions its outputted control signal to '1'. As such, N0 turns on, followed by N1 and N2 turning on thereafter. Feedback transistor mpu assists in turning on transistor N1. N0, N1 and N2 drive the output terminal Q to $V_{SS}$.

Assume now that low speed mode is selected. In such a case, HS=LSB='0' and HSB=LS='1'. Transistors mPL, mNL, mpc and mnc are thus enabled. Consider first a transition of the input signal D from logic '0' to logic '1'. As before, the rise of the voltage level of input signal D first causes inverters I2 and I11 to transition their outputted control signals to logic '0', before the voltage level of input signal D reaches $V_{DD}/2$. N0 turns off first followed by N1 and N2 turning off. Next, when the voltage level of input signal D rises above $V_{DD}/2$, inverter I1 transitions its outputted control signal to logic '0', thereby turning on P0.

Inverter I10 actually attempts to drive its output to logic '0' approximately when the voltage level of the input signal reaches $V_{DD}/2$. However, prior to this point in time, the edge detector 132 has detected the rising edge of the transition in logic value of the input signal D. The edge detector 132 outputs a pulse aligned with the rising edge to the pulse generator 134. The pulse generator 134, in turn, outputs a pulse with a constant low level voltage, in signal PTU, to the gate of mpc. As noted above, mpc has a greater driving capacity than I10. So long as the signal PTU is at the low voltage level, the gate of P1 and P2 remain at a high voltage level. As noted above, the period of the constant voltage level pulse can be controlled rather precisely and remains substantially unvarying over a variety of temperatures.

After the pulse in PTU, i.e., as soon as the voltage level of PTU returns to its high voltage level, mpc turns off. At that point, I0 can drive the gates of P1 and P2 to a logic '0' thereby turning on the transistors P1 and P2. Illustratively, the delay caused by the predetermined period pulse is greater than the delay incurred in turning on P1 and P2 during the fast speed operating mode, and in any event, longer than the delay before P0 turns on.

Assume now that the input signal D transitions its logic value from '1' to '0'. As before, the fall of the voltage level of input signal D first causes inverters I1 and I10 to transition their outputted control signals to logic '1', before the voltage level of input signal D reaches $V_{DD}/2$. P0 turns off first followed by P1 and P2 turning off. Next, when the voltage level of input signal D falls below $V_{DD}/2$, inverter I2 transitions its outputted control signal to logic '1', thereby turning on N0.

Inverter I11 actually attempts to drive its output to logic '1' approximately when the voltage level of the input signal reaches $V_{DD}/2$. However, prior to this point in time, the edge detector 132 has detected the falling edge of the transition in logic value of the input signal D. The edge detector 132 outputs a pulse aligned with the falling edge to the pulse generator 134. The pulse generator 134, in turn, outputs a pulse with a constant high level voltage, in signal PTD, to the gate of mnc. As noted above, mnc has a greater driving capacity than I11. So long as the signal PTD is at the high voltage level, the gate of N1 and N2 remain at a low voltage level.

After the pulse in PTD, i.e., as soon as the voltage level of PTD returns to its low voltage level, mnc turns off. At that point, I11 can drive the gates of N1 and N2 to a logic '1' thereby turning on the transistors N1 and N2. Again, the delay caused by the predetermined period pulse is greater than the delay incurred in turning on N1 and N2 during the fast speed operating mode, and in any event, long e r than the delay before N0 turns on.

Note the following features of the output buffer 100:
(1) During a transition, the transistors N0, N1 and N2 are not on at the same time as transistors P0, P1 and P2. Thus, short circuit currents are reduced.

(2) During a transition, the small current driving transistor N0 or P0 turns on before the large current driving capacity transistors N1, N2 or P1, P2. As such, the low current capacity transistor partially drive (i.e., charge or discharge) the output terminal Q to the voltage level to which it is transitioned before the large current capacity transistors N1, N2 or P1, P2 turn on. Thus, high currents produced by the transistors N1, N2 or P1, P2 change less rapidly so as to suppress ground bounce.

(3) The delay elements DL connected between the transistors N1, N2 and P1, P2 cause the transistors N1 and N2 or P1 and P2 to turn on in succession thereby further reducing the rate of current change and thus further suppressing ground bounce.

(4) During low speed operating mode, the delay between transitioning the driver I10 and the driver 120 to the new voltage is controlled by a pulse having a width that can be set relatively precisely and in a process and temperature invariant fashion. Thus, a rather precise delay can be achieved.

Figure 7:
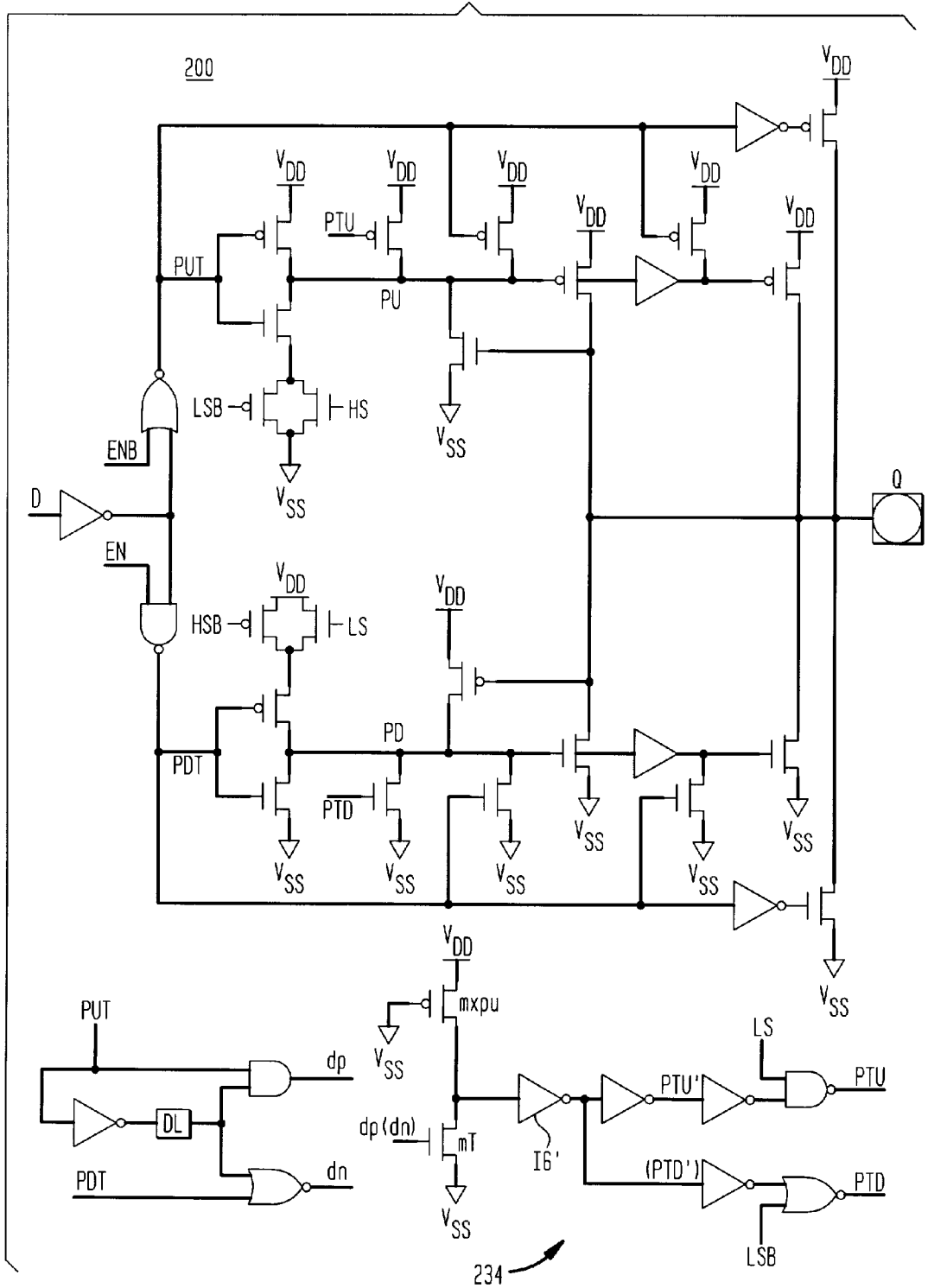
FIG. 7 shows an output buffer according to another embodiment of the present invention.

FIG. 7 shows an output buffer 200 according to another embodiment of the present invention. The output buffer 200 is very similar to the output buffer 100 and therefore only the differences between these two output buffers is discussed. The output buffer 200 has a different pulse generator 234 than the output buffer 100. Specifically, the resistor Rpu is replaced with a PMOS transistor mxpu having its gate connected to the low voltage $V_{SS}$ power supply bus, its source connected to the high voltage $V_{DD}$ power supply bus and its drain connected to the drain of mT and the input of inverter I6'. Inverter I6' is an ordinary inverter rather than a Schmidt trigger. The pulse generator 234 is less accurate than the pulse generator 134. For instance, the resistance of the channel mxpu does exhibit some process variation and does vary somewhat with temperature. Likewise, the inverter I6' and has a trigger level than does exhibit some process and temperature variation. Nevertheless, in certain applications, the pulse produced by the pulse generator 234 is within prescribed limits and provides adequate performance. The pulse generator 234 is simpler and easier to manufacture, and furthermore requires less surface area of the IC chip. Thus, a tradeoff is made between accuracy and simplicity and conservation of IC chip layout area.

Figure 8A:
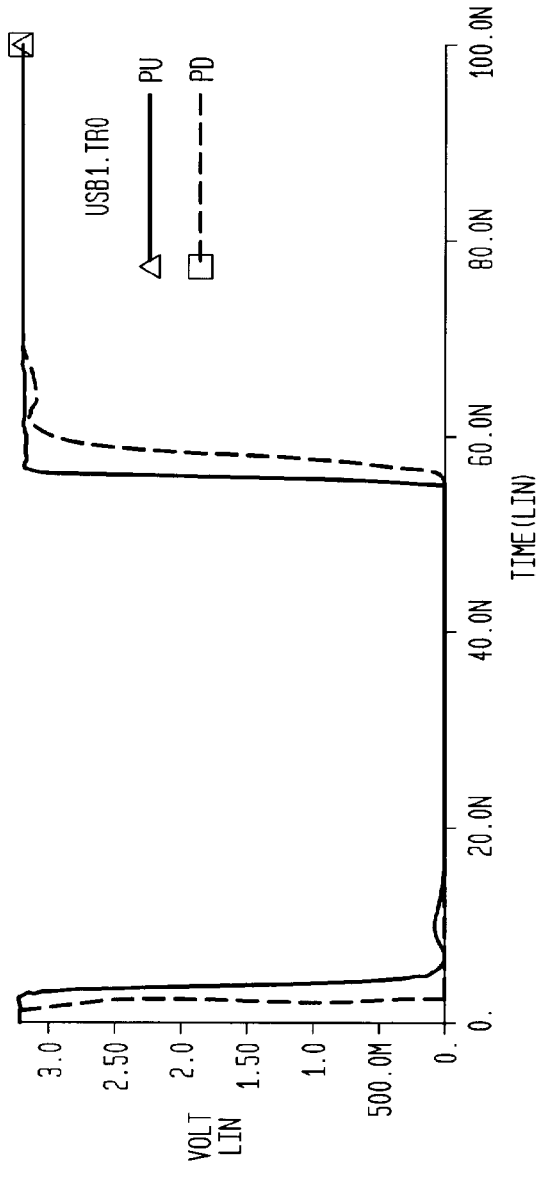
FIG. 8 shows a plot of input, output and control signals during a full speed mode of operation.
Figure 8B:
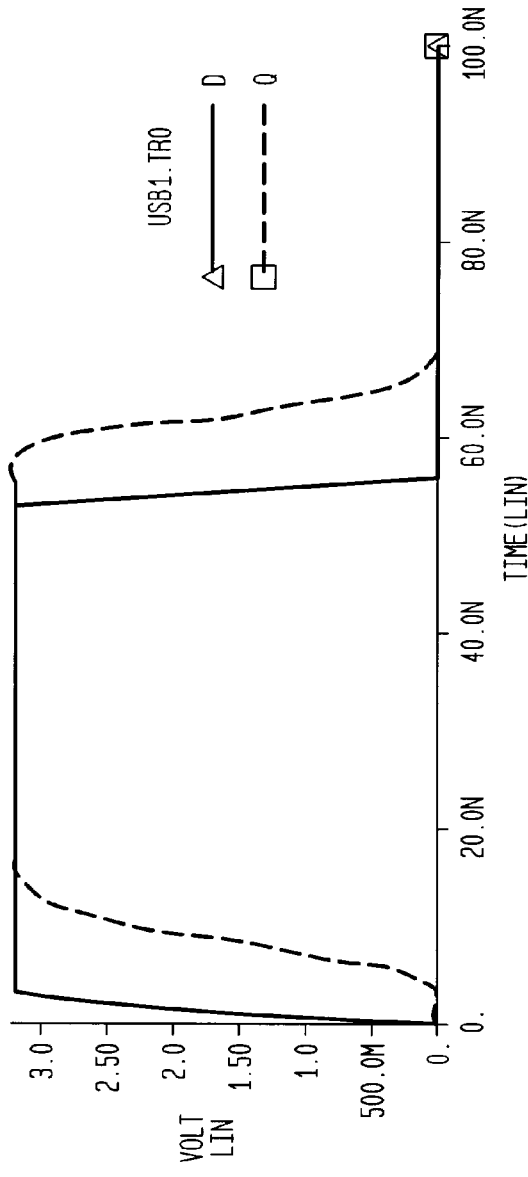
Figure 9A:
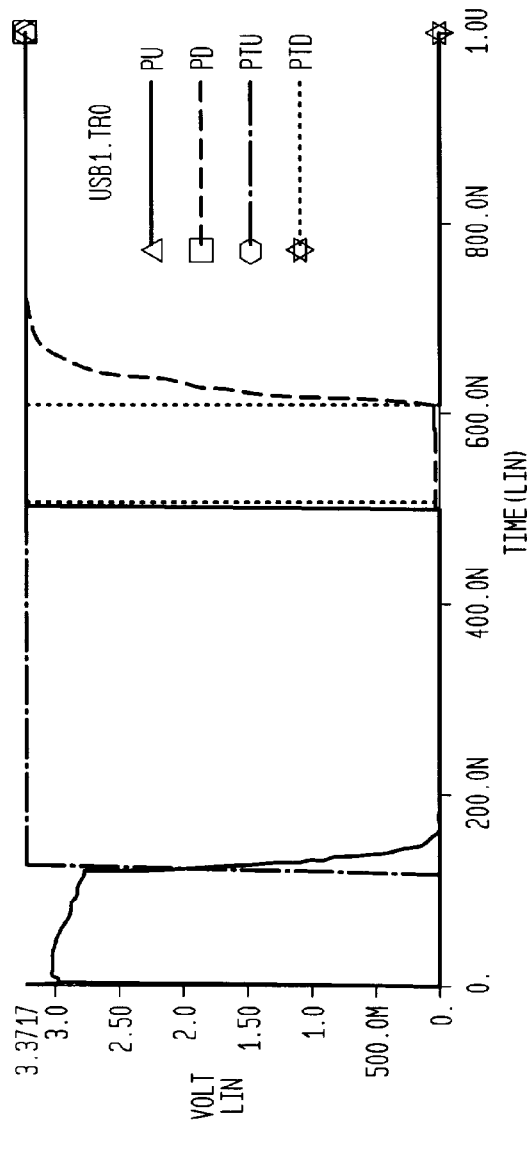
FIG. 9 shows a plot of input, output and control signals during a low speed mode of operation.
Figure 9B:
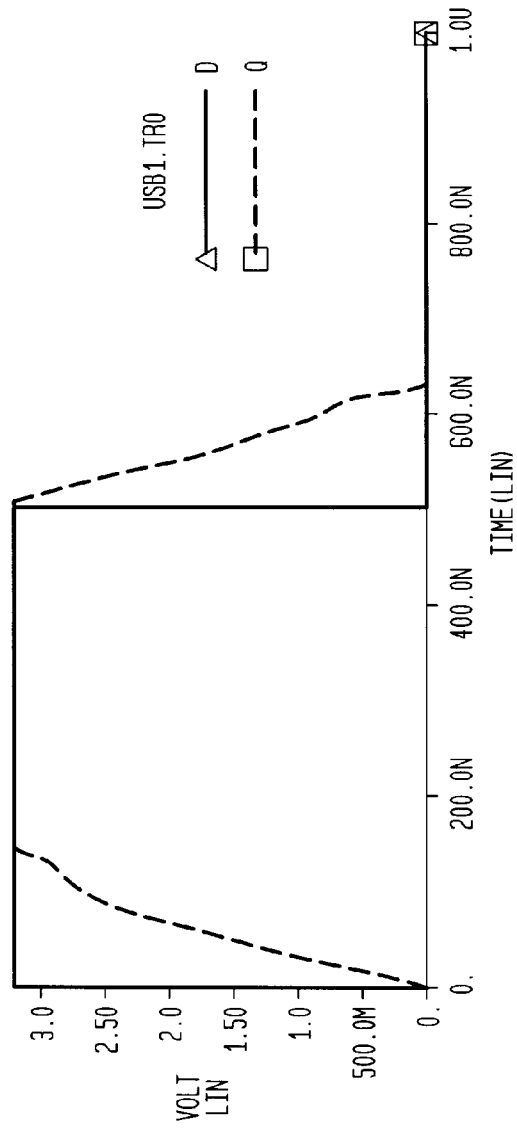

Finally, FIGS. 8 and 9 present plots of input signal D, output terminal voltage Q, nodes PD and PU and signals PTU and PTD for a simulated circuit using the design principles of the output buffer 200 according to the present invention (total PMOS width=1200 $\mu$m and total NMOS width=512 $\mu$m). The various PMOS and NMOS transistor parameters are selected to achieve full speed and low speed data communication according to the following USB specifications:

TABLE 1

|  | full speed | low speed |
| --- | --- | --- |
| rise time fall time | 4–20 nsec (90%–110%) | 75–300 nsec (70%–130%) |
| delay | 0–12 nsec (50 pF load) | <300 nsec (50–350 pF load) |
| data rate | 12 Mbits/sec | 1.5 Mbits/sec |

FIG. 8 shows a plot for full speed operation and FIG. 9 shows a plot for low speed operation assuming typical operating parameters (note that a 60 pF total load is used in the simulation corresponding to the 50 pF USB specified load plus a 10 pF parasitic capacitance). Tables 2 and 3 summarize the results for best, typical and worst high voltage levels $V_{DD}$, operating temperatures and permissible loads.

TABLE 2

Full Speed

| Parameter | Best | Typical | Worst |
|---|---|---|---|
| $V_{DD}$ | 3.6 volts | 3.3 volts | 3.0 volts |
| Temperature | 0° C. | 25° C. | 85° C. |
| Load | 60 pF | 60 pF | 60 pF |
| Fall time | 4.26 nsec | 5.97 nsec | 9.24 nsec |
| Rise time | 4.52 nsec | 6.42 nsec | 10.23 nsec |
| $t_{plh}$ | 4.91 nsec | 6.94 nsec | 11.87 nsec |
| $t_{phl}$ | 5.15 nsec | 7.46 nsec | 11.89 nsec |

TABLE 3

Low Speed

| Parameter | Best | Typical | Worst |
|---|---|---|---|
| $V_{DD}$ | 3.6 volts | 3.3 volts | 3.0 volts |
| Temperature | 0° C. | 25° C. | 85° C. |
| Load | 60 pF | 60 pF | 360 pF |
| Fall time | 76.3 nsec | 104.7 nsec | 171.0 nsec |
| Rise time | 80.0 nsec | 110.7 nsec | 168.3 nsec |
| $t_{plh}$ | 37.8 nsec | 52.1 nsec | 237.7 nsec |
| $t_{phl}$ | 46.6 nsec | 62.8 nsec | 263.4 nsec |

As shown, the output buffer according to the present invention meets the USB specification operating requirements.

The above discussion is intended to be merely illustrative of the invention. Those having ordinary skill in the art may devise numerous alternative embodiments without departing from the spirit and scope of the following claims.

The invention claimed is:

1. An output buffer comprising:
   an input signal,
   an output terminal,
   a first driver for driving said output terminal to a voltage level corresponding to a logic value of said input signal,
   a second driver, having a greater driving capacity than said first driver, for driving said output terminal to said voltage level corresponding to said logic value of said input signal, and
   control circuitry which detects a transition in said logic value of said input signal, generates a particular pulse aligned with said transition having a particular constant voltage level for a predetermined time period and delays said second driver from driving said output terminal to a complementary voltage level corresponding to said logic value to which said input signal transitions during said predetermined time period,
   wherein said control circuitry receives at least one mode signal said control circuitry delaying said second driver from driving said output terminal to a complementary voltage level corresponding to said logic value to which said input signal transitions during said predetermined time period, only in response to a low speed mode indication of said at least one mode signal, said control circuitry delaying said second driver from driving said output terminal to a complementary voltage level corresponding to said logic value to which said input signal transitions by a second period, that is less than said predetermined period, in response to a full speed mode indication of said at least one mode signal.

2. The output buffer of claim 1 wherein said control circuit delays said second driver from driving said output terminal to a complementary voltage level corresponding to said logic value to which said input signal transitions by at least said second period so that said second driver begins to drive said output terminal to said complementary voltage level after said first driver begins to drive said output terminal to said complementary voltage level.

3. An output buffer comprising:
   an input signal,
   an output terminal,
   a first driver for driving said output terminal to a voltage level corresponding to a logic value of said input signal,
   a second driver, having a greater driving capacity than said first driver, for driving said output terminal to said voltage level corresponding to said logic value of said first driver, and
   control circuitry which detects a transition in said logic value of said input signal, generates a particular pulse aligned with said transition having a particular constant voltage level for a predetermined time period and delays said second driver from driving said output terminal to a complementary voltage level corresponding to said logic value to which said input signal transitions during said predetermined time period, said control circuitry comprising an edge detector receiving a transition signal with transition that depend on said logic transitions of said input signal, for generating a first pulse that is aligned with a transition of said logic signal,
   wherein said edge detector comprises:
      a logic gate having a first input receiving said transition signal and a second input, and
      a delay element receiving said transition signal and outputting said transition signal, after a delay, to the second input of said logic gate,
      wherein in response to a particular transition of said transition signal, said logic gate outputs a pulse aligned with said transition for a period that depends on said delay of said delay element.

4. An output buffer comprising:
   an input signal,
   an output terminal,
   a first driver for driving said output terminal to a voltage level corresponding to a logic value of said input signal,
   a second driver, having a greater diving capacity than said first driver, for driving said output terminal to said voltage level corresponding to said logic value of said input signal,
   control circuitry which detects a transition in said logic value of said input signal, generates a particular pulse aligned with said transition having a particular constant voltage level for a predetermined time period and delays said second driver from driving said output terminal to a complementary voltage level corresponding to said logic value to which said input signal transitions during said predetermined time period said control circuitry comprising an edge detector receiving a transition signal with transition that depend on said logic transitions of said input signal ,for generating a first pulse that is aligned with a transition of said logic signal, and
   a pulse generator receiving said first pulse and generating said particular pulse by changing a voltage level of a signal outputted from said pulse generator to said particular constant level for said predetermined period and then restoring said signal outputted from said pulse generator to an original level prior to said change.

5. The output buffer of claim 4 wherein said pulse generator comprises:
   a MOS transistor having a gate that receives said first pulse, a source connected to a power supply bus and a drain,
   a resistive load connected between said drain of said MOS transistor and a second power supply bus, and
   an inverter having an input connected to said drain,
   wherein said MOS transistor turns on in response to said first pulse and drives said input of said inverter to a particular voltage level, wherein after said first pulse, said MOS transistor turns off and a current conducting through said resistive load restores an original voltage level of said input of said inverter, said inverter changing said voltage level of said signal outputted from said pulse generator for said predetermined period beginning after said MOS transistor drives said input of said inverter to said particular voltage and ending when a voltage level of said input as restored by said current conducting through said resistive load crosses a predetermined threshold.

6. The output buffer of claim 5 wherein said resistive load is a resistor and said inverter is a Schmidt trigger.

7. The output buffer of claim 5 wherein said resistive load is a channel of a MOS transistor.

8. The output buffer of claim 4 further comprising:
   enable circuitry connected to an output of said pulse generator and responding to at least one mode select signal for selectively enabling and disabling said pulse generator.

9. The output buffer of claim 8 wherein said enable circuitry comprises at least one logic gate receiving one of said at least one mode signal and said signal outputted from said pulse generator, said at least one logic gate outputting a signal in response to a full speed mode indication of said received mode signal and outputting said signal that depends only on said signal outputted from said pulse generator in response to receiving a low speed mode indication.

10. The output buffer of claim 4 further comprising:
    an override MOS transistor having a gate receiving said signal outputted from said pulse generator, a source connected to a particular power supply bus and a drain connected to an input of said second driver, said override MOS transistor driving said input of said second driver to a voltage level of said particular power supply bus, so as to prevent said second driver from driving said output terminal to said complementary voltage level, during said predetermined period.

11. An output buffer comprising:
    an input signal,
    an output terminal,
    a control circuitry,
    a first driver for diving said output terminal to a voltage level corresponding to a logic value of said input signal,
    a second driver, having a greater driving capacity than said first driver, for driving said output terminal to said voltage level corresponding to said logic value of said input signal, said second driver comprising:
      a first MOS transistor having a source connected to a particular power supply bus, a drain connected to said output terminal and a gate receiving a control signal from said control circuitry for enabling said first MOS transistor to drive said output terminal to a voltage level of said particular power supply bus, when said input signal logic value corresponds to said voltage level of said particular power supply bus,
      a delay element having an input connected to said gate of said first MOS transistor, and
      a second MOS transistor having a source connected to said particular power supply bus, a drain connected to said output terminal and a gate connected to an output of said delay element, so that when said control signal enables said first MOS transistor, said second MOS transistor is enabled to drive said output terminal to said voltage level of said particular power supply bus after a delay of said delay element, and
    said control circuitry detecting a transition in said logic value of said input signal, generates a particular pulse aligned with said transition having a particular constant voltage level for a predetermined time period and delays said second driver from driving said output terminal to a complementary voltage level corresponding to said logic value to which said input signal transition during said predetermined time period.

12. The output buffer of claim 11 further comprising:
    first and second turn off MOS transistors for driving said gates of said first and second MOS transistors to said voltage level of said particular power supply bus so as to quickly turn off said first and second transistors when said input signal logic value corresponds to a complement of said voltage level of said power supply bus.

13. The output buffer of claim 11 further comprising:
    feedback MOS transistor having a source connected to a second power supply bus of second voltage level, that is a complement of said voltage level of said particular power supply bus, a drain connected to said gate of said first MOS transistor and a gate connected to said output terminal so that when said control signal begins to drive said gate of said first transistor to said second voltage level, said first MOS transistor begins to turn on and to drive said output terminal to said voltage level of said particular power supply bus, and said feedback MOS transistor turns on and assists in driving said gate of said first MOS transistor to said second voltage level.

14. The output buffer of claim 1 wherein said second driver comprises at least one MOS transistor for driving said output terminal to a particular voltage level, said control circuitry comprising:
    an inverter for outputting a control signal to said gate of said MOS transistor so as to enable said MOS transistor to drive said output terminal to said particular level voltage when said input signal logic value corresponds to said particular voltage level, said inverter responding to said full speed mode indication by outputting a control signal for enabling said MOS transistor to drive said output terminal in response to a voltage level of said input signal transitioning more than half way to said input signal logic value that corresponds to said particular voltage level.

15. The output buffer of claim 14 wherein said inverter responds to said full speed mode by outputting a control signal for enabling said MOS transistor to drive said output terminal to said particular voltage sooner after said transition of said input signal logic value that corresponds to said particular voltage level than in response to said slow speed mode indication.

16. The output buffer of claim 15 wherein said inverter comprises:
- a first NMOS transistor having a gate connected to an input of said inverter and a drain connected to an output of said inverter,
- a first PMOS transistor having a gate connected to an input of said inverter and a drain connected to an output of said inverter,
- a second NMOS transistor and a second PMOS transistor having their sources connected to a power supply bus and their drains connected to a source of said first PMOS transistor, when said power supply bus supplies a high voltage, or to a source of said first NMOS transistor, when said power supply bus supplies a low voltage, wherein during a full speed mode, said second NMOS transistor is enabled, when said second NMOS transistor is connected to said first NMOS transistor, and said second PMOS transistor is enabled, when said second PMOS transistor is connected to said first PMOS transistor, so as to speed up a transition of said inverter output during fill speed mode.

* * * * *